July 8, 1969 D. M. JACKSON, JR., ET AL 3,454,434

MULTILAYER SEMICONDUCTOR DEVICE

Filed May 9, 1966

INVENTORS
Don M. Jackson Jr.
Orville Phillip Frazee
BY Peter Waldow

Mueller, Aichele & Rauner
ATTY'S.

United States Patent Office
3,454,434
Patented July 8, 1969

3,454,434

MULTILAYER SEMICONDUCTOR DEVICE

Don M. Jackson, Jr., and Orville Phillip Frazee, Phoenix, and Peter Waldow, Scottsdale, Ariz., assignors to Motorola, Inc., Franklin Park, Ill., a corporation of Illinois Filed May 9, 1966, Ser. No. 548,525
Int. Cl. H01l 3/14, 7/36, 9/12
U.S. Cl. 148—33.5 4 Claims

ABSTRACT OF THE DISCLOSURE

A four-layer diode (PNPN) is constructed by a method wherein each active layer of the device is formed by epitaxial growth, beginning with a low-resistivity substrate. Doping-level is controlled during the growth of each epitaxial layer in order to provide the two emitter junctions with substantially the same emitter efficiency. Also, the two intermediate layers of the device are provided with a substantially equal effective impurity concentration.

This invention relates to a novel multilayer semiconductor structure, and more particularly relates to a multilayer, low voltage semiconductor structure having regions therein with closely controlled electrical characteristics previously unattainable. The invention also relates to a novel method for producing such a structure.

Heretofore, semiconductor structures containing a plurality of regions have been formed by diffusing impurities into a wafer and establishing the different regions therein. One of the disadvantages of such structures has been that the succeeding diffusions have had increasing impurity concentrations which limited the characteristics of the final devices. Furthermore, the diffusion gradient which occurred in the various diffusions did not provide a high degree of uniformity in the various layers adversely affecting the performance characteristics of devices produced therefrom. Thus, four-layer diodes with forward breakover voltages of less than about 20 volts have not been commercially available.

The use of epitaxial deposition to produce multilayer structures has been proposed, but has not been employed commercially due to difficulties in achieving desired electrical characteristics.

An object of the present invention is to provide a multilayer semiconductor structure which has a substantially lower forward breakover voltage than heretofore attainable.

Another object of the invention is to provide a multilayer semiconductor structure with closely controlled, predetermined electrical characteristics in the individual layers.

A further object of the invention is to provide a multilayer semiconductor structure which permits a wide variation in the electrical characteristics thereof.

An additional object of the invention is to provide a novel method for producing the above structure.

A feature of the invention is a multilayer semiconductor structure in which all of the rectifying junctions therein are spaced from the substrate and at least the one closest to the substrate is between adjacent epitaxially deposited layers.

Another feature of the invention is a method of forming such a multilayer semiconductor structure.

Figure 1:
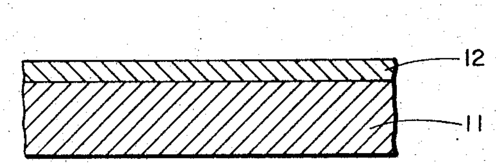
Figure 2:
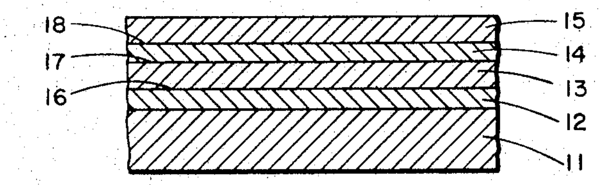

The invention is illustrated by the accompanying drawing in which:

FIG. 1 is a sectional view of a substrate with a first epitaxial layer deposited thereon in the fabrication of a multilayer semiconductor structure of the invention; and FIG. 2 is a sectional view of a multilayer semiconductor structure which is one embodiment of the invention.

The present invention is embodied in a multilayer semiconductor structure comprising a substrate of predetermined conductivity type, a first epitaxially deposited layer on the substrate of a semiconductor material having the same conductivity type as the substrate, a second epitaxially deposited layer on the first layer of different conductivity type from that of the first layer, and at least a third layer adjoining the second layer of the same conductivity type as the first layer.

The present invention is also embodied in a method of forming a multilayer semiconductor structure comprising the steps of epitaxially depositing a first layer of a semiconductor material on a substrate of predetermined conductivity type, the first layer being of the same conductivity type as that of the substrate, epitaxialy depositing a second layer of the semiconductor material on the first layer, the second layer being of different conductivity type from that of the first layer, and forming at least a third layer of the semiconductor material adjoining the second layer, the third layer being of the same conductivity type as that of the first layer.

The substrate employed in the fabrication of the multilayer semiconductor structure of the invention is advantageously a single crystal element of silicon although various other semiconductor materials also may be employed. The crystal element is preferably a wafer which is typically obtained from a larger crystal grown by known crystal pulling or zone melting processes. The larger crystal is sliced into wafers and the wafers lapped, polished and otherwise processed to make their major faces substantially parallel to each other. The cross-sectional dimension of the wafers may be of any value and the thickness can be within a practical range, e.g., about 4 to 40 mils.

The epitaxial deposition of the semiconductor layers on the substrate starting material may be accomplished in a conventional epitaxial reactor, for example, a quartz tube having an RF induction heating coil around the outside of the tube which heats the wafers while maintaining the tube at a lower temperature. The substrate wafers are placed on a suitable carrier such as a quartz-covered graphite boat during treatment.

Prior to the deposition of the first epitaxial layer on the substrate wafer, it is advantageous to etch or polish the surface of the wafer. This may be accomplished employing a gas phase etching method in which a stream of hydrogen containing a small proportion of a hydrogen halide is passed over the surface of the wafer while the wafer is heated to an elevated temperature. This gas phase etching method is the subject of Corrigan and Smith Patent No. 3,243,323, issued Mar. 29, 1966.

After the surface of the wafer has been polished and cleaned, a first layer of epitaxial material is deposited on the substrate. This first layer, as pointed out above, is of the same conductivity type as that of the substrate so no rectifying junction is formed between the two materials. Thus, an epitaxial layer serves as the first active region of the device. The use of an epitaxial layer as the first active region of the structure rather than the substrate provides a greater degree of control of the electrical characteristics of the final device since the epitaxial layer can be deposited with greater uniformity of doping, both within a single wafer and particularly from wafer to wafer than can be obtained with conventional substrate wafers.

The growth of the epitaxial layers in accordance with the invention advantageously may be accomplished employing the techniques disclosed in Law Patent No. 3,173,814, issued Mar. 16, 1965. According to the procedure of that patent, a small amount of a gaseous doping source such as diborane, phosphine, arsine, boron trichloride, antimony pentachloride, etc., is mixed with hydrogen gas and the resulting mixture injected into a main gas stream flowing though the epitaxial reactor. The main gas stream includes a source of semiconductor material so that the epitaxial layers deposited on the substrate contain a small proportion of an impurity which produces a layer of predetermined conductivity type, i.e., P type or N type. The concentration of the impurity affects the resistivity of the material deposited. The process of the Law patent provides a high degree of control of the impurity concentration and distribution in the epitaxial layers so that the predetermined characteristics of the layers and the device can be achieved with a high degree of accuracy.

The semiconductor compound used to form the vapors employed in the epitaxial deposition steps may be any of the known sources employed in the semiconductor art and advantageously is a compound from the group consisting of the semiconductor tetrachlorides, trichlorides and hydrides.

The proportion of the semiconductor compound in the main carrier gas stream is advantageously between about 0.01% and 10% by volume. The proportion of the gaseous doping impurity is advantageously in the range of about $10^{-5}$ to $10^4$ parts per million in the carrier gas stream.

The wafer is heated to an elevated temperature which is above a minimum temperature, that is, above about 500° C. for germanium and above about 800° C. for silicon. Advantageously, the temperature when germanium material is deposited is between about 500° and 900° C., and preferably between about 600° and 800° C. In the deposition of silicon, the temperature is advantageously between about 800° and 1400° C., and preferably between about 900° and 1300° C.

After the first epitaxial layer has been deposited on the substrate, the reactor is flushed with an inert gas such as hydrogen and then a second layer of different conductivity from that of the first layer is epitaxially deposited on the surface of the first layer. This second layer is formed in the same way as the first layer but employing a different dopant or impurity. In each case, the employment of the method of the Law patent provides for the deposition of epitaxial layers of predetermined impurity concentration and distribution throughout the layer. Thereafter, successive layers or regions of alternating differing conductivity are formed adjacent to the prior layer. While it is preferred that all of the layers be formed by epitaxial deposition, one or more of the layers after the first two epitaxially deposited layers may be formed by other processes such as diffusion or alloying.

In the embodiment shown in the drawing, a semiconductor wafer 11 has a first epitaxial layer 12 on the surface thereof. FIG. 2 shows the structure of FIG. 1 with succeeding epitaxial layers of alternating conductivity 13, 14 and 15 deposited on the first layer 12. The differences in the conductivity type of layers 12 to 15 create P-N junctions 16, 17 and 18.

While the particular conductivity type, resistivity and thickness for each layer will depend upon the characteristics desired in the final device, it is apparent that the method of the present invention provides a high degree of control over the parameters for each layer or region. For example, in a four-layer diode having four active regions with bases in adjoining layers 13 and 14 and emitters in layers 12 and 15 adjacent thereto, it is often advantageous that the structure be symmetrical with the two emitter junctions 16 and 18 having the same emitter efficiency. To make a structure symmetrical with a low forward breakover voltage, i.e., less than 20 volts, it is necessary that the junction 17 as shown in FIG. 2 be an abrupt junction and that the effective impurity concentration in base layer 13 be equal to the effective impurity concentration of base layer 14. However, since layer 13 is of one conductivity type and layer 14 is of a different conductivity type, the resistivities of the respective layers would not be the same. In the fabrication of such a structure as shown in the drawing, the depletion of the junction 17 between layers 13 and 14 would spread equally into layers 13 and 14. Thus, the impurity concentrations in the layers 13 and 14 would be such that the depletion region will be the same in each of layers 13 and 14.

The following examples illustrate specific embodiments of the invention, although it is not intended that the examples restrict the scope of the invention. In the examples, percentages are by volume.

EXAMPLE I

A number of single crystal silicon wafers of a size about one inch in diameter and about eight mils thick having a resistivity of about 0.01 ohm-centimeters and N type conductivity were placed on a quartz-covered graphite boat and the boat inserted into an epitaxial reactor. The wafers were heated to a temperature of about 1,100° C. in an atmosphere of hydrogen. A gas mixture containing about 0.3% of silicon tetrachloride and $6\times10^{-5}$% of phosphine in a stream of hydrogen gas having a flow rate of about 33 liters per minute was passed over the wafers for a period of about 4 minutes. Thereafter, the reactor was flushed with hydrogen gas for about 2 minutes, and a gas mixture containing about 0.3% silicon tetrachloride and $9\times10^{-5}$% diborane in a hydrogen gas stream having a flow rate of about 33 liters per minute was passed over the wafers for about 4 minutes. The reactor was then flushed with hydrogen gas, and a new gas mixture containing about 0.3% silicon tetrachloride and about $6\times10^{-5}$% phosphine in a hydrogen gas mainstream having a flow rate of about 33 liters per minute was passed over the wafers for 3 minutes. The reactor was again flushed with hydrogen gas for about 2 minutes and then a mixture comprising 0.3% silicon tetrachloride and $1.8\times10^{-4}$% diborane in a hydrogen mainstream having a flow rate of about 33 liters per minute was passed over the wafers for about 7 minutes. The reactor was cooled and the wafers removed.

The wafers were examined using the conventional bevel and stain method and found to have a series of four layers deposited thereon. The top layer was of P conductivity type and had a resistivity of about 0.008 ohm-centimeters as measured with a four-point probe. The next layer was of N conductivity type and had a resistivity of about 0.01 ohm-centimeters. The third layer was of P conductivity type and had a resistivity of about 0.03 ohm-centimeters. The layer adjacent to the substrate was of N conductivity type and had a resistivity of about 0.01 ohm-centimeters.

Four-layer diodes made from the above epitaxially deposited wafers were tested by conventional industry accepted tests, and found to have a forward voltage of about 9.8 volts and a reverse voltage of about 17 volts. In comparison, four-layer diodes made by diffusion techniques had a forward voltage of about 20 volts or more.

Thus, devices made according to the present invention have substantially lower breakover voltages than those made by diffusion techniques.

The following table lists characteristics of other four-layer diodes made according to the method of the invention:

| Forward voltage | Base layer imp. concen., atoms/cc. | P base resistivity, ohm-cm. | N base resistivity, ohm-cm. | P base to N base thickness ratio |
|---|---|---|---|---|
| 6 | $1\times10^{19}$ | 0.01 | 0.006 | 1.89 |
| 8 | $2\times10^{18}$ | 0.04 | 0.017 | 1.65 |
| 10 | $1\times10^{18}$ | 0.065 | 0.026 | 1.55 |
| 12 | $5\times10^{17}$ | 0.095 | 0.036 | 1.52 |
| 14 | $3.1\times10^{17}$ | 0.14 | 0.047 | 1.50 |
| 16 | $2.3\times10^{17}$ | 0.17 | 0.055 | 1.50 |
| 18 | $1.8\times10^{17}$ | 0.19 | 0.062 | 1.46 |
| 20 | $1.5\times10^{17}$ | 0.22 | 0.073 | 1.45 |

The above description, examples and drawing show that the present invention provides a novel multilayer semiconductor structure which has a substantially lower forward breakover voltage than heretofore attainable.

In addition, the invention provides a structure in which all of the rectifying junctions therein are spaced from the substrate. Also, the invention provides a structure with closely controlled, predetermined electrical characteristics in the individual layers thereof. Further, the present invention provides a multilayer semiconductor structure which permits a wide variation in the electrical characteristics thereof. The invention, moreover, provides a novel method of producing such structures.

What is claimed is:

1. A multilayer semiconductor structure comprising a substrate of one conductivity type, a first epitaxially deposited layer on said substrate of a semiconductor material of the same conductivity type as said substrate, a second epitaxially deposited layer on said first layer of the opposite conductivity type, a third epitaxially deposited layer on said second layer having the same conductivity type as said first layer, and a fourth epitaxially deposited layer on said third layer of the same conductivity type as said second layer, the PN junction formed between said first and second layers having substantially the same emitter efficiency as the PN junction formed by said third and fourth layers; said second and third epitaxially deposited layers having substantially equal effective impurity concentrations; each of said epitaxially deposited layers having a substantially uniform dopant profile.

2. A multilayer semiconductor structure according to claim 1 in which the substrate has a P type conductivity.

3. A multilayer semiconductor structure according to claim 1 in which the substrate has an N type conductivity.

4. A multilayer semiconductor structure according to claim 1 in which the substrate is single crystal silicon and all of the layers are epitaxially deposited layers.

References Cited

UNITED STATES PATENTS

| | | | |
|---|---|---|---|
| 2,855,524 | 10/1958 | Shockley | 317—235 |
| 3,006,791 | 10/1961 | Webster | 148—33 |
| 3,131,098 | 4/1964 | Krsek et al. | 148—175 |
| 3,168,422 | 2/1965 | Allegretti | 148—175 |
| 3,172,791 | 3/1965 | Allegretti | 148—175 |
| 3,271,208 | 9/1966 | Allegretti | 148—175 |

L. DEWAYNE RUTLEDGE, *Primary Examiner.*

R. A. LESTER, *Assistant Examiner.*

U.S. Cl. X.R.

148—174, 175; 317—235